United States Patent
Carey et al.

(10) Patent No.: US 7,522,392 B2
(45) Date of Patent: Apr. 21, 2009

(54) MAGNETORESISTIVE SENSOR BASED ON SPIN ACCUMULATION EFFECT WITH TERMINAL CONNECTION AT BACK END OF SENSOR

(75) Inventors: Matthew J. Carey, San Jose, CA (US); Bruce A. Gurney, San Rafael, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 780 days.

(21) Appl. No.: 11/131,737

(22) Filed: May 17, 2005

(65) Prior Publication Data
US 2006/0262458 A1 Nov. 23, 2006

(51) Int. Cl.
*G11B 5/39* (2006.01)
(52) U.S. Cl. .................. 360/324.2; 360/314; 360/319; 360/322
(58) Field of Classification Search ............................... 360/119.02–119.04, 324, 324.1–324.2, 314, 360/319, 322, 324.11–324.12
See application file for complete search history.

(56) References Cited
U.S. PATENT DOCUMENTS
7,061,797 B1 * 6/2006 Miltat et al. ............... 365/171
2002/0114111 A1 * 8/2002 Zhu ........................ 360/324.1
2004/0257714 A1 * 12/2004 Takahashi et al. ........... 360/322
2005/0002128 A1 * 1/2005 Ito et al. .................. 360/324.2
2005/0105222 A1 * 5/2005 Sbiaa et al. ............... 360/324.1

OTHER PUBLICATIONS

Jedema et al., "Electrical detection of spin precession in a metallic mesoscopic spin valve", Nature, vol. 416, Apr. 2002, pp. 713-716.
George et al., "Direct measurement of spin accumulation in a metallic mesoscopic structure", Physical Review B 67, 012410 (2003).

* cited by examiner

*Primary Examiner*—Craig A Renner
*Assistant Examiner*—Carlos E Garcia
(74) *Attorney, Agent, or Firm*—Thomas R. Berthold

(57) ABSTRACT

A magnetoresistive (MR) read head based on the spin accumulation effect has no electrical terminal and associated insulating layer in the read gap. The spin-accumulation type MR read head has an electrically conductive strip located on an insulating layer on the lower magnetic shield with a first end at the sensing end of the head and a second end at the back end of the head recessed from the sensing end. At the sensing end of the head, the upper magnetic shield is located on the free layer without an insulating layer. A resistance-detection circuit is electrically coupled to the upper shield and the lower shield at the back end of the head. At the back end of the head, an electrical terminal is located on the fixed layer and electrically insulated from the upper shield and a current-supply circuit is electrically coupled to the terminal and the lower shield.

12 Claims, 4 Drawing Sheets

MAGNETORESISTIVE SENSOR BASED ON SPIN ACCUMULATION EFFECT WITH TERMINAL CONNECTION AT BACK END OF SENSOR

BACKGROUND OF THE INVENTION

1. Field of the Invention

This invention relates generally to magnetoresistive (MR) sensors, such as MR read heads for magnetic recording disk drives, and more particularly to MR sensors based on the spin accumulation effect.

2. Description of the Related Art

One type of conventional MR sensor, often called a "spin-valve" (SV) sensor, has a stack of layers that include two ferromagnetic layers separated by a nonmagnetic spacer layer. One ferromagnetic layer has its magnetization direction fixed, such as by being pinned by exchange coupling with an adjacent antiferromagnetic layer, and the other ferromagnetic layer has its magnetization direction "free" to rotate in the presence of an external magnetic field. With a sense current applied to the sensor, the rotation of the free-layer magnetization relative to the fixed-layer magnetization is detectable as a change in electrical resistance. The SV MR read head used in all current magnetic recording hard disk drives operates with the sense current directed parallel to the planes of the layers in the sensor layer stack, so it is referred to as a current-in-the-plane (CIP) sensor.

A type of MR read head based on a magnetic tunnel junction (MTJ) has been proposed. In an MTJ MR read head the nonmagnetic spacer layer between the free and fixed ferromagnetic layers is a nonmagnetic tunnel barrier layer, typically formed of alumina. The MTJ MR read head operates with tunneling current perpendicular to the planes (CPP) of the layers in the sensor stack, and the tunneling current that passes perpendicularly through the layers depends on the relative orientation of the magnetizations in the two ferromagnetic layers.

In both types of MR read heads, the magnetization of the fixed or pinned layer is generally perpendicular to the plane of the disk, and the magnetization of the free layer is generally parallel to the plane of the disk in the absence of an external magnetic field. When exposed to an external magnetic field from a data bit recorded on the disk, the free-layer magnetization will rotate, causing a change in electrical resistance. The free and fixed ferromagnetic layers are located between two magnetic shields at the sensing end that faces the disk. The shields prevent magnetic fields from bits adjacent the bit being read from reaching the read head. The shields sharpen the spatial response and improve the resolution of the read head along the data track. The spacing between the shields is called the read gap. The size of the read gap affects the resolution of the read head along-the-track and thus the bit density along the track, so it is desirable to keep the read gap as small as possible.

A type of MR sensor and read head based on "spin accumulation" has been proposed in US 2005/0002128 A1 and US 2004/0257714 A1. This type of sensor is based on the experimental results published by F. J. Jedema et al., "Electrical detection of spin precession in a metallic mesoscopic spin valve", *Nature*, Vol. 416, April 2002, pp. 713-716. This type of MR sensor has an electrically conductive strip with a first tunnel barrier and a free ferromagnetic layer on the front or sensing end of the strip and second tunnel barrier and a fixed ferromagnetic layer on the back end of the strip. When current is passed from the fixed ferromagnetic layer through the second tunnel barrier into the back end of the strip and the fixed ferromagnetic layer is magnetized in a direction so that the number of spin up electrons in that layer is higher than the number of spin-down electrons, then spin-up electrons accumulate below the second tunnel barrier. However since the strip is nonmagnetic the degree of the spin-accumulation decays exponentially with a characteristic length scale equal to the spin diffusion length of the of the electrons in the strip material. If the front end of the strip is located at a distance about equal to or shorter than the spin diffusion length then the spin accumulation is detected as a voltage across the front end. This voltage depends on the direction of magnetization of the free ferromagnetic layer so that when the free layer is exposed to an external magnetic field the electrical resistance across the first tunnel barrier changes.

In the proposed MR read head based on the spin accumulation effect, an electrical terminal is located at the sensing end in contact with the free layer and thus in the read gap between the magnetic shields. Because the current that is directed through the back end of the strip uses the shields as the electrical leads, the terminal must have an associated insulating layer to electrically isolate it from the shields. Thus both the terminal and the insulating layer increase the size of the read gap.

What is needed is an MR sensor based on the spin accumulation effect with an electrical lead structure that minimizes the size of the read gap.

SUMMARY OF THE INVENTION

The invention is a disk drive MR read head based on the spin accumulation effect that has no electrical terminal and associated insulating layer in the read gap. The electrically conductive strip is located on an insulating layer on the lower magnetic shield. At the sensing end of the head that faces the disk, the upper magnetic shield is located on the free layer without an insulating layer. The upper shield extends to the back end of the head. A resistance-detection circuit is electrically coupled to the upper shield and the lower shield at the back end of the head. At the back end of the head, an electrical terminal is located on the fixed layer and electrically insulated from the upper shield. A current-supply circuit is electrically coupled to the terminal and the lower shield at the back end of the head. Because there is no electrical terminal in contact with the free layer and thus no need for an associated insulating layer, the size of the read gap is reduced.

For a fuller understanding of the nature and advantages of the present invention, reference should be made to the following detailed description taken together with the accompanying figures.

DETAILED DESCRIPTION OF THE INVENTION

The sensor of this invention can be used as a magnetoresistive (MR) read head for magnetic recording disk drives and thus the operation of a conventional disk drive will be briefly described with reference to FIGS. 1-3. However, the sensor of this invention is fully applicable as a magnetic field sensor and as a read head for magnetic recording media other than magnetic recording disks.

Figure 1:
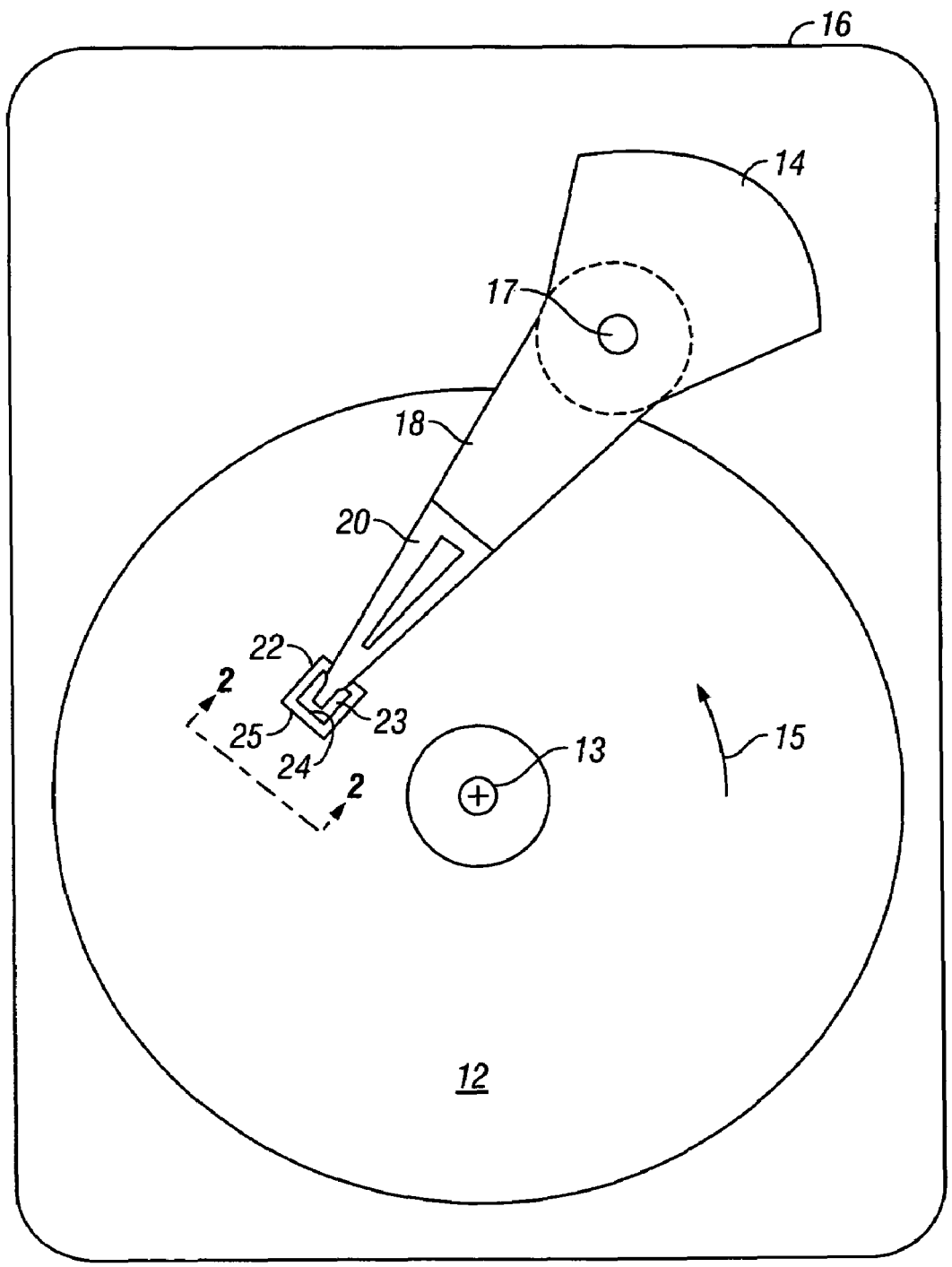
FIG. 1 is a schematic top view of a conventional magnetic recording hard disk drive with the cover removed.

FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
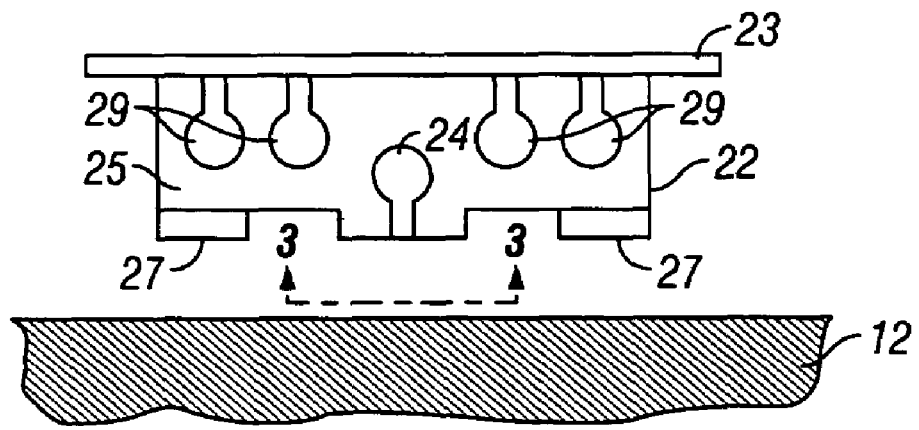
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and an end face or trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the slider's trailing surface 25 and is connected to the disk drive read/write electronics by electrical connection to terminal pads 29 on the trailing surface 25.

Figure 3:
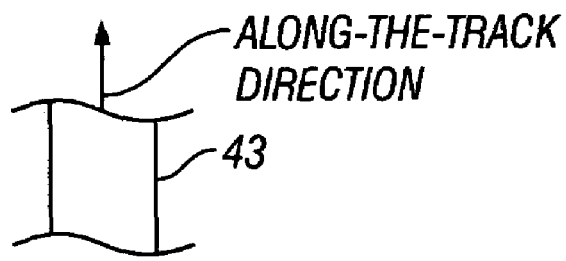
FIG. 3 is a view in the direction 3-3 of FIG. 2 and shows the ends of the read/write head as viewed from the disk superimposed on a portion of a data track.
Figure 3:
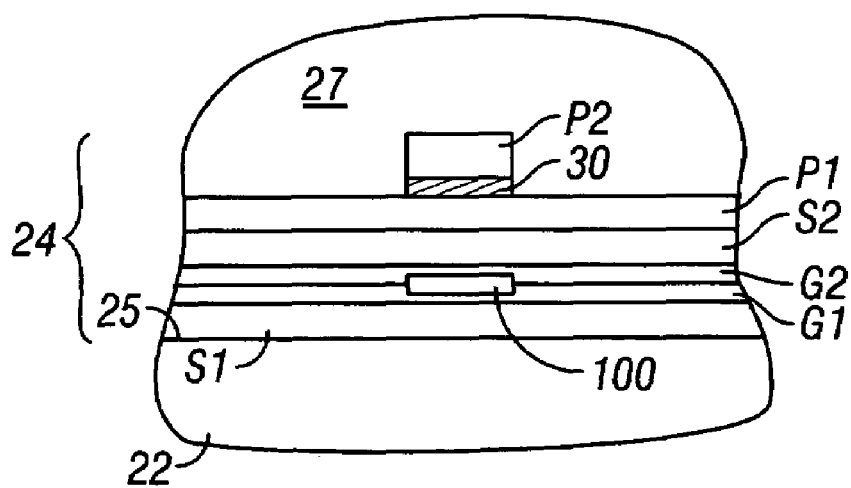

FIG. 3 is a view in the direction 3-3 of FIG. 2 and shows the ends of read/write head 24 on ABS 27 as viewed from the disk 12 and superimposed on a data track 43. The read/write head 24 is a series of thin films deposited and lithographically patterned on slider 22. Slider 22 is typically a wafer of ceramic material, such as a composite of alumina ($Al_2O_3$) and titanium carbide (TiC), or silicon.

The write head includes magnetic write poles P1 and P2 separated by a write gap 30. When write current is directed to the write head a magnetic field is generated across the write gap 30 in a direction along the data track 43 to magnetize regions of the data track. The MR sensor or read head 100 is located between two insulating gap layers G1, G2 that are typically formed of alumina. Gap layers G1, G2 are located between magnetic shields S1 and S2. The shields are typically formed of permalloy (NiFe) or sendust (FeAlSi). When the read head 100 is detecting a magnetic transition (a data "bit") from the data track 43, the shields S1, S2 prevent magnetic flux from neighboring transitions in the data track from reaching the read head. The shields sharpen the spatial response and improving the resolution of the read head 100 in the along-the-track direction. The spacing between S1 and S2 is called the read gap. The size of the read gap affects the resolution of the read head along-the-track and thus the bit density along the track, so it is desirable to keep the read gap as small as possible.

Figure 4A:
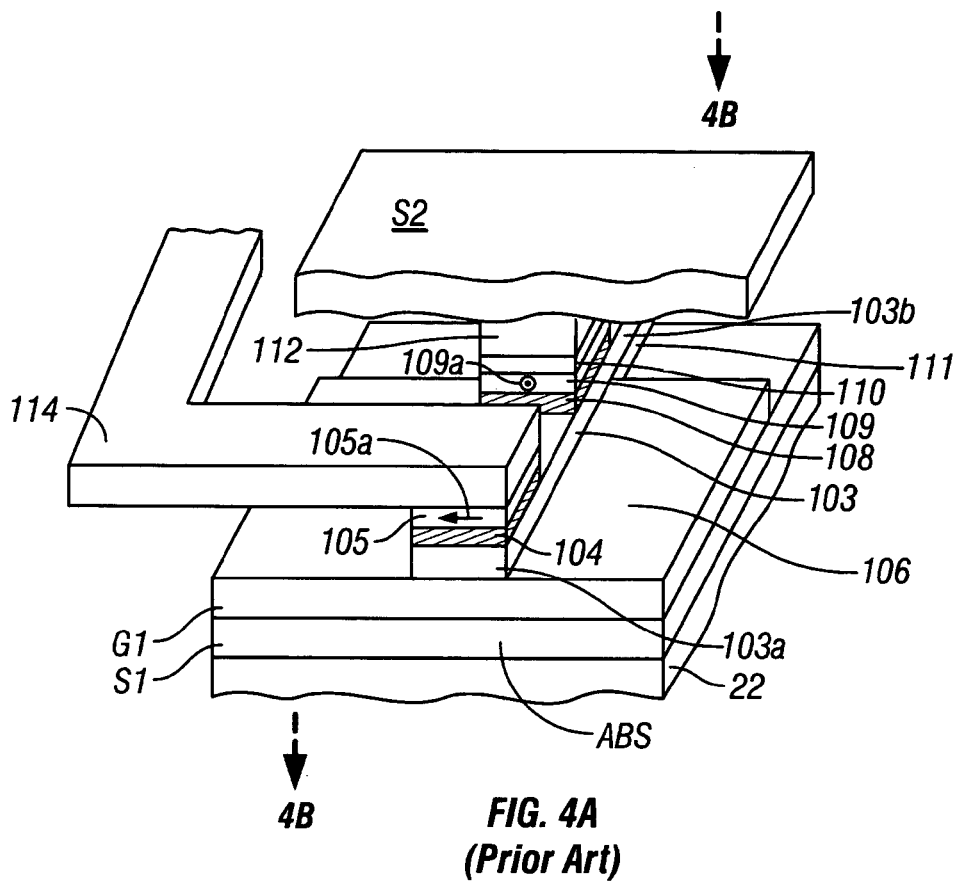
FIGS. 4A-4B illustrate perspective and side-sectional view, respectively, of a prior art MR read head based on the spin accumulation effect.
Figure 4B:
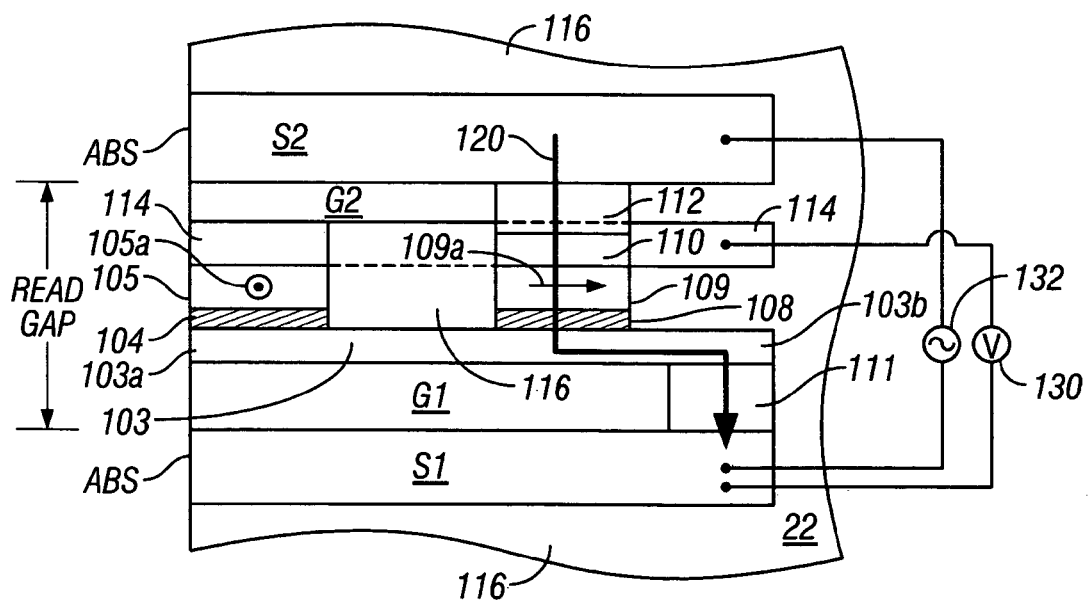

FIG. 4A is a perspective view of an MR read head based on the spin accumulation effect with the head's upper magnetic shield S2 in partial cutaway. FIG. 4B is a sectional view of the MR read head of FIG. 4A taken through section 4B-4B. Published applications US 2005/0002128 A1 and US 2004/0257714 A1 describe a disk drive MR read head based on the spin accumulation effect. The substrate for the head is the body of slider 22 with S1 formed on it and G1 formed on S1. The head includes an electrically conductive strip 103 that has a first or sensing end 103a near the ABS and a second or back end 103b recessed from the ABS. The strip 103 is formed of electrically conducting material, such as aluminum (Al), copper (Cu) or semiconductor material like GaAs. A first tunnel barrier 104 is deposited on the first end 103a, and a second tunnel barrier 108 is deposited on the second end 103b. The tunnel barrier material is typically alumina, magnesium oxide (MgO) or any of the well-known materials proposed for use in magnetic tunnel junction devices.

At the first or sensing end of the head a first or sensing ferromagnetic layer 105 is formed on first tunnel barrier 104. The sensing ferromagnetic layer 105 has its in-plane magnetic moment or magnetization direction 105a oriented generally parallel to the ABS in the absence of an external magnetic field, i.e., magnetic fields from recorded data bits in the magnetic recording layer of the disk. The sensing ferromagnetic layer 105 is called the "free" layer because its magnetization direction 105a is free to rotate in the presence of magnetic fields from the recorded data. At the second or back end of the head a second or "fixed" ferromagnetic layer 109 is formed on the second tunnel barrier 108. The fixed ferromagnetic layer 109 has its in-plane magnetic moment or magnetization direction 109a oriented substantially orthogonal to the ABS and prevented from rotation in the presence of magnetic fields in the range of interest, i.e., magnetic fields from the recorded data. The fixed ferromagnetic layer 109 is typically a pinned ferromagnetic layer that is exchange-coupled with an antiferromagnetic pinning layer 110 that results in the magnetization direction 109a of layer 109 being "pinned" from rotation in the presence of magnetic fields from the recorded data. The fixed layer 109 can also be the well-known antiparallel-pinned (AP-pinned) structure, also called a "laminated" pinned layer, as described in U.S. Pat. No. 5,465,185. The AP-pinned structure comprises a ferromagnetic pinned layer, a non-magnetic spacer layer and a ferromagnetic reference layer.

The free layer 105 and fixed layer 109 are typically formed of an alloy of one or more of Co, Fe and Ni, or a bilayer of two alloys, such as a CoFe—NiFe bilayer. The antiferromagnetic layer 110 is typically formed of a sufficiently thick Mn alloy layer (PtMn, NiMn, FeMn, IrMn, PdMn, PtPdMn or RhMn). A PtMn layer needs to be thicker than approximately 100 Å to become chemically-ordered and antiferromagnetic when annealed, and an IrMn layer is antiferromagnetic as deposited when it is thicker than approximately 40 Å. These antiferromagnetic Mn alloys may also include small amounts of additional elements, such as Cr, V, Pt, Pd and Ni that are typically added to improve corrosion resistance or increase electrical resistance. While not shown in FIGS. 4A-4B, the head may include a conventional ferromagnetic biasing layer or layers at the sensing end for biasing the magnetic moment of free layer 105 to stabilize its magnetic moment longitudinally in the direction 105a parallel to the ABS and linearize the output of the head.

In FIG. 4A, the head's upper magnetic shield S2 is shown in cutaway so that the sensing end of the head can be shown. An electrical terminal 114 is located on free layer 105 and extends toward the back end of the head. As shown in FIG. 4B, terminal 114 is electrically insulated from S2 by the electrically insulating material, typically alumina, of gap layer G2. A resistance-detection circuit 130, depicted as a voltage-measuring circuit, is electrically coupled to terminal 114 and electrically conductive shield S1 at the back end of the head.

As shown in FIG. 4B, a current-supply circuit 132 is electrically coupled to electrically conductive shields S1, S2. Electrical contact layers or leads 111, 112 are located below and above, respectively, the fixed layer 109 at the back end of the head. Circuit 132 supplies current (depicted by arrow 120) through S2, contact layer 112, pinning layer 110, fixed layer 109, tunnel barrier 108, and contact layer 111 to shield S1. This circuit path is electrically insulated from terminal 114 by surrounding insulating material 116, typically alumina. When current 120 is passed through the back end of the head by circuit 132, the tunnel barrier 108 provides a high electron-spin-dependent resistance that enhances the spin polarization of the current injected into the back end 103b of the strip 103. Spin accumulation, i.e., unequal densities of spin-up and spin-down electrons, occurs in the strip 103, and diffuses along the length of the strip 103 to the front end 103a. This spin accumulation is detected as a voltage across the sensing end of the head by circuit 130. When the free layer 105 is exposed to external magnetic fields from the recorded data while current is passing at the back end of the head, the electrical resistance across the tunnel barrier 104 changes and is detected by circuit 130.

As shown in FIG. 4B, both the terminal 114 and G2 are located at the sensing end of the head between S1 and S2. The thickness of terminal 114 and G2 contribute to the size of the read gap. Because S2 must be located at the ABS and because terminal 114 must be electrically isolated from S2 to avoid a short circuit of current-supply circuit 132, the insulating gap layer G2 is required to be located between terminal 114 and S2.

Figure 5A:
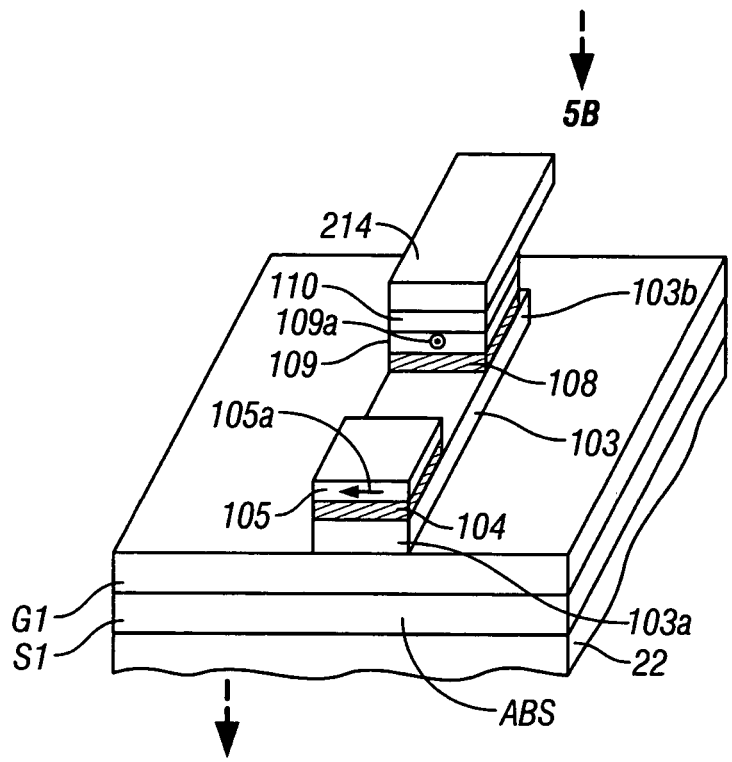
FIG. 5A is a perspective view of the sensor of this invention, depicted as an MR read head with the upper shield removed.
Figure 5B:
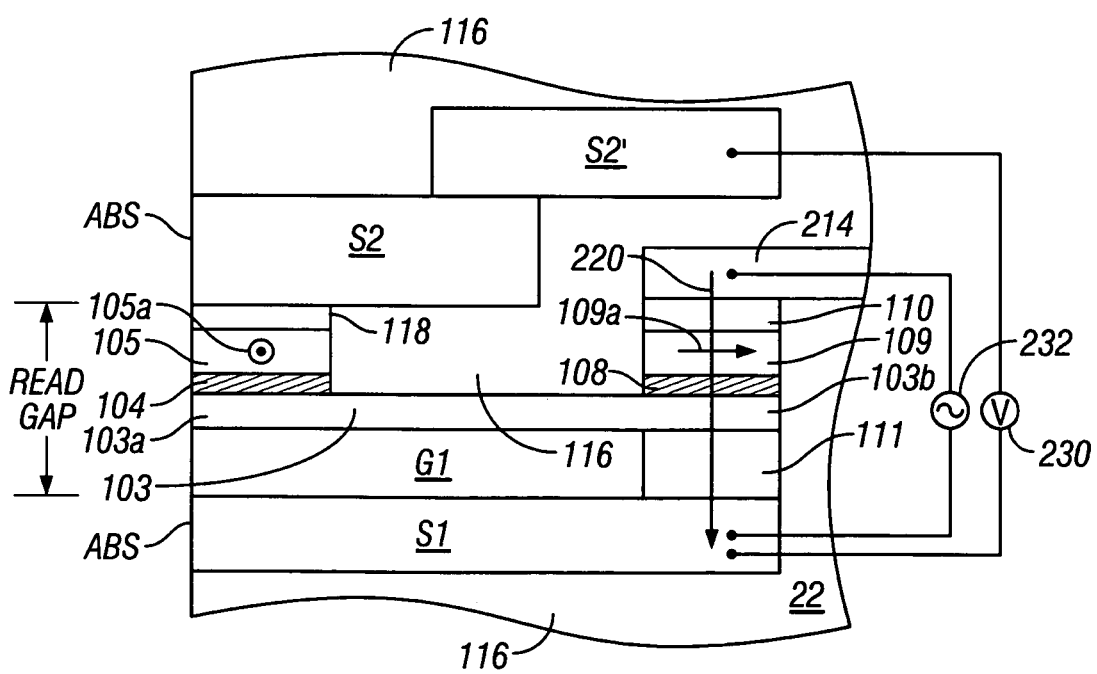
FIG. 5B is a side sectional view of the MR read head of FIG. 5A taken through section 5B-5B.

FIG. 5A is a perspective view of the sensor of this invention, depicted as an MR head with the upper shield removed. FIG. 5B is a sectional view of the MR read head of FIG. 5A taken through section 5B-5B. At the sensing end of the head, the upper magnetic shield S2 is located on the free layer 105 without an insulating gap layer G2. An electrically-conducting nonmagnetic spacer layer 118 is located between free ferromagnetic layer 105 and the magnetic shield S2. Layer 118 may be formed of a material like Ta, Rh, Cu or Au, and prevents any magnetic coupling or interaction between layers 105 and S2 while providing electrical connection between layer 105 and S2. S2 includes a back portion S2' above S2, so that S2 extends to the back end of the head, i.e., the end recessed from the sensing end at the ABS. Thus at the back end of the head the spacing between S1 and S2' is greater than the spacing between S1 and S2 at the sensing end (the read gap). S2 and S2' are depicted as two distinct layers but they can be a single conformal layer having the general shape as shown in FIG. 5A after deposition. A resistance-detection circuit 230, depicted as a voltage-measuring circuit, is electrically coupled to electrically conductive shields S1 and S2' at the back end of the head.

A current-supply circuit 232 is electrically coupled to an electrical terminal 214 and lower shield S1 at the back end of the head. The electrical terminal 214 is located on the fixed ferromagnetic layer 109. If the fixed layer 109 is a pinned layer, then an antiferromagnetic pinning layer 110 is in contact with fixed layer 109 and the terminal 214 is in contact with the pinning layer 110. An optional electrical contact layer (not shown, but like layer 112 in FIG. 4B) can be located between pinning layer 110 and terminal 214. An electrical contact layer 111 is located below the back end 103b of the strip, which is located below fixed layer 109. Circuit 232 supplies current (depicted by arrow 220) through terminal 214, optional contact layer (not shown), pinning layer 110, fixed layer 109, tunnel barrier 108, and contact layer 111 to shield S1. This circuit path is electrically insulated from S2 by surrounding insulating material 116, typically alumina.

The terminal 214, contact layer 111 and optional contact layer 112 can be formed of Cu or any of the known materials used as electrical leads in conventional MR heads, such as Ta, Rh, Cu or Au. While both circuits 230 and 232 are shown as having electrical connection to the end 103b of the conductive strip 103 through the lower shield S1 and contact layer 111, both circuits could be directly connected to the strip 103 with suitable electrical leads.

As shown in FIG. 5B, because there is no terminal in contact with the free layer 105 at the sensing end of the head, the size of the read gap is reduced by the thickness of the terminal. In addition, because there is no terminal in the read gap, there is no need to insulate it from the shield S2, so there is no need to have gap layer G2 at the sensing end, which further reduces the size of the read gap.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor capable of sensing an external magnetic field and having a sensing end for exposure to the external magnetic field and a back end spaced from the sensing end, the sensor being a magnetoresistive read head for reading magnetically recorded data from a magnetic recording medium and comprising:

an electrically conductive substrate, the substrate being a first shield S1 formed of magnetically permeable material;

a first electrical insulator on S1, said first electrical insulator being a first gap layer G1;

an electrically conductive strip on the insulator and having a first end at the sensing end of the sensor and a second end at the back end of the sensor;

a first tunnel barrier on the strip at the first end;

a sensing ferromagnetic layer on the first tunnel barrier and having an in-plane magnetization direction oriented substantially in a first direction in the absence of an external magnetic field, said sensing layer magnetization direction being substantially free to rotate in the presence of an external magnetic field;

an electrically conductive layer on the sensing layer, said electrically conductive layer being a second shield S2 formed of magnetically permeable material, the spacing between S1 and S2 at the sensing end of the sensor defining a read gap and wherein there is no second gap layer G2 in said read gap;

a second tunnel barrier on the strip at the second end;

a fixed ferromagnetic layer on the second tunnel barrier and having an in-plane magnetization direction oriented in a second direction substantially orthogonal to said first direction and substantially prevented from rotation in the presence of an applied magnetic field in the range of interest; and an electrical terminal on the fixed layer, the terminal being electrically insulated from the electrically conductive layer on the sensing layer; whereby when current is directed through the terminal, the fixed layer and the second tunnel barrier into the second end of the strip at the back end of the sensor, the detection of a change in electrical resistance between the electrically conductive layer on the sensing layer and the electrically conductive substrate will indicate the presence of an external magnetic field at the sensing end of the sensor.

2. The sensor of claim 1 further comprising an antiferromagnetic layer exchange-coupled with the fixed layer for substantially preventing rotation of the magnetization direction of the fixed layer in the presence of an external magnetic field in the range of interest, the antiferromagnetic layer being located between the fixed layer and the terminal.

3. The sensor of claim 1 further comprising a nonmagnetic spacer layer between the sensing layer and the electrically conductive layer.

4. The sensor of claim 1 further comprising an electrically conductive contact layer between the second end of the strip and the electrically conductive substrate at the back end of the sensor, whereby when current is directed though the terminal, the fixed layer and the second tunnel barrier into the second end of the strip it passes through the contact layer into the substrate.

5. The sensor of claim 4 further comprising a current-supply circuit electrically coupled to the terminal and the substrate.

6. The sensor of claim 1 further comprising a current-supply circuit electrically coupled to the terminal and the second end of the strip.

7. The sensor of claim 1 further comprising a resistance-detection circuit electrically coupled to the electrically conductive layer on the sensing layer at the sensing end of the sensor and to the substrate.

8. The sensor of claim 1 wherein the spacing between S1 and S2 at the back end of the read head is greater than the read gap.

9. A magnetoresistive read head based on the spin accumulation effect for reading magnetically recorded data from a magnetic recording medium, the head having a sensing end for facing the medium and a back end recessed from the sensing end, the head comprising:
  a head carrier having a substantially planar substrate;
  a first magnetic shield S1 on the substrate;
  a first electrically insulating gap layer G1 on S1;
  an electrically conductive strip on G1 and having a first end at the sensing end and a second end at the back end;
  a first tunnel barrier on the strip at the sensing end of the head;
  a free ferromagnetic layer on the first tunnel barrier and having an in-plane magnetization direction oriented substantially in a first direction in the absence of a magnetic field from the medium and substantially free to rotate in the presence of a magnetic field from the medium;
  a nonmagnetic spacer layer on the free layer;
  a second magnetic shield S2 on the free layer and extending to the back end of the head, the spacing between S1 and S2 at the back end of the head being greater than the spacing between S1 and S2 at the sensing end of the head;
  a second tunnel barrier on the strip at the back end of the head;
  a pinned ferromagnetic layer on the second tunnel barrier and having an in-plane magnetization direction oriented in a second direction substantially orthogonal to said first direction and substantially prevented from rotation in the presence of a magnetic field from the medium;
  an antiferromagnetic pinning layer exchange-coupled with the pinned layer for substantially preventing rotation of the magnetization direction of the pinned layer;
  an electrical terminal on the pinning layer, the terminal being electrically insulated from S2; and
  a resistance-detection circuit electrically coupled to S2 and S1 at the back end of the head; whereby when current is directed through the terminal, the pinning layer, the pinned layer and the second tunnel barrier into the second end of the strip at the back end of the head, the detection of a change in electrical resistance between S2 and S1 indicates the presence of a magnetic field from the medium at the sensing end of the head.

10. The head of claim 9 further comprising an electrically conductive contact layer between the second end of the strip and S1 at the back end of the head, whereby when current is directed though the terminal, the pinning layer, the pinned layer and the second tunnel barrier into the second end of the strip it passes through the contact layer into S1.

11. The head of claim 10 further comprising a current-supply circuit electrically coupled to the terminal and S1 at the back end of the head.

12. The head of claim 9 further comprising a current-supply circuit electrically coupled to the terminal and the second end of the strip at the back end of the head.

* * * * *